United States Patent [19]

Oikawa

[11] Patent Number: 5,675,160
[45] Date of Patent: Oct. 7, 1997

[54] SEMICONDUCTOR MEMORY DEVICE HAVING AN INTERNAL AMPLIFICATION FUNCTION

[75] Inventor: Ryuichi Oikawa, Tokyo, Japan

[73] Assignee: NEC Corporation, Tokyo, Japan

[21] Appl. No.: 616,580

[22] Filed: Mar. 15, 1996

[30] Foreign Application Priority Data

Mar. 15, 1995 [JP] Japan .................................. 7-055467

[51] Int. Cl.[6] .................................................. H01L 27/108
[52] U.S. Cl. .................... 257/296; 257/298; 257/300; 257/301
[58] Field of Search .............................. 257/296, 298, 257/300, 301, 368, 71

[56] References Cited

U.S. PATENT DOCUMENTS 4,920,391   4/1990   Uchida ...................... 357/23.6
5,463,234  10/1995   Toriumi et al. ................ 257/296

FOREIGN PATENT DOCUMENTS 62-67861   3/1987   Japan .
1-255269  10/1989   Japan .

Primary Examiner—Minh-Loan Tran
Attorney, Agent, or Firm—Sughrue, Mion, Zinn, Macpeak & Seas, PLLC

[57] ABSTRACT

In a DRAM memory cell comprising one capacitor having a capacitor electrode and an opposing electrode, and one insulated gate field effect transistor formed in a semiconductor substrate and having a pair of source/drain regions, one of which is connected to the capacitor electrode of the capacitor. A double gate thin film transistor having the same channel conductivity type as that of the insulated gate field effect transistor, is formed above the insulated gate field effect transistor. A first gate electrode of the thin film transistor is constituted of a gate electrode of the insulated gate field effect transistor, and a second gate electrode of the thin film transistor is constituted of the capacitor electrode of the capacitor. A source region of the thin film transistor and the other of the pair of source/drain regions of the insulated gate field effect transistor is connected to a bit line, and a drain region of the thin film transistor is connected to a power supply line.

3 Claims, 6 Drawing Sheets 5,675,160

SEMICONDUCTOR MEMORY DEVICE HAVING AN INTERNAL AMPLIFICATION FUNCTION

BACKGROUND OF THE INVENTION

1. Field of the Invention

The present invention relates to a semiconductor memory device, and more specifically to a semiconductor memory composed of DRAM cells having an internal amplification function.

2. Description of Related Art

A conventional DRAM (dynamic random access memory) cell has been composed of one capacitor and one transistor acting as a transfer gate to the capacitor, in order to minimize the number of constituents and a necessary cell area. In this one transistor/one capacitor type (abbreviated to "1T/1C" in this specification) of memory cell, information is stored and read, by causing existence and non-existence of an electric charge in the capacitor to correspond to logic values "1" and "0", respectively. In order to read information, the transfer gate is turned on, namely, rendered conductive, so that the capacitor of the memory cell is short-circuited to a bit line, and a change of a potential on the bit line caused by a capacitance division effect, is detected and amplified by a sense amplifier. In this detection operation, it is required that a potential change or difference sufficient to give no hindrance in operation is obtained on the bit line. Therefore, even if the memory cell area is reduced, it is not allowed to reduce the capacitance of the memory cell capacitor. Accordingly, since the memory cell area has been considerably reduced in an advanced generation of DRAM, it is going to become difficult to ensure the capacitance of the memory cell capacitor.

In order to solve the above mentioned situation, a so-called gain cell has been proposed, in which a sense transistor is added in a memory cell, so that an amplification function is internally provided in the memory cell, whereby it becomes permissible to reduce the capacitance of the memory cell capacitor. This gain cell is proposed in Japanese Patent Application Laid-open Publication No. JP-A-62-067861 and Japanese Patent Application Laid-open Publication No. JP-A-01-255269 (which corresponds to U.S. Pat. No. 4,920,391), the disclosure of which is incorporated by reference in its entirety into the present application.

Referring to FIG. 1, there is shown a diagrammatic partial sectional view of the gain cell proposed by Japanese Patent Application Laid-open Publication No. JP-A-62-067861. FIG. 2 is an equivalent circuit diagram of the gain cell proposed by Japanese Patent Application Laid-open Publication No. JP-A-62-067861. In the following, the prior art disclosed by Japanese Patent Application Laid-open Publication No. JP-A-62-067861 will be called a "first prior art".

As shown in FIG. 1, the gain cell of the first prior art includes a p-type silicon substrate 101 having a field isolation insulator 102 formed on a principal surface thereof, and a gate electrode 104 formed through a first gate insulator film 103 on the principal surface of the silicon substrate 101. A pair of $n^+$ diffused regions 105 and 105A are formed in the principal surface of the silicon substrate 101, separately from each other, as a pair of source/drain regions forming therebetween a channel region covered by the gate insulator film 103. Thus, an n-channel write transistor is formed.

A first interlayer insulator film 106 is deposited to cover the gate electrode 104 and the $n^+$ diffused regions 105 and 105A. Further, a third gate insulator film 107 is formed on the $n^+$ diffused region 105A, and a contact plug 108 is formed to pass through the interlayer insulator film 106 so as to reach the $n^+$ diffused region 105. Thereafter, a polysilicon film is deposited to cover the whole surface, and then, is so patterned so that $p^+$ polysilicon films 109 and 109A, a first polysilicon film 110, a second polysilicon 111 and a reference voltage (for example, ground) line conductor 112 are formed as shown. Furthermore, a second gate insulator film 113 and a read gate electrode 114 are stacked on the first polysilicon film 111. In addition, a second interlayer insulator film 115 are deposited to cover the whole surface, and a bit line 116 is formed on the second interlayer insulator film 115. This bit line 116 is connected to the $p^+$ polysilicon films 109 through a hole formed through the second interlayer insulator film 115. Thus, a fundamental structure of the gain cell is completed.

As seen from the above, a sense transistor is constituted to have a gate electrode formed of the $n^+$ diffused region 105A and a pair of source/drain regions formed of the $p^+$ polysilicon film 109A and the reference voltage line 112. A read transistor is constituted of the read gate electrode 114 and a pair of source/drain regions formed of the $p^+$ polysilicon films 109 and 109A. Accordingly, the sense transistor and the read transistor, which are formed of a p-channel thin film transistor, are stacked on the n-channel write transistor, and are connected in series to each other, as shown in the equivalent circuit of FIG. 2. In addition, a cell-capacitor CS is formed by the $n^+$ diffused region 105A, the third gate insulator film 107 and the reference voltage line 112.

Now, operation of the gain cell of the first prior art will be described with reference to FIG. 2. In a writing, a write word line WWL is elevated to a high voltage so as to turn on the n-channel write transistor N1, so that an electric charge is written into the cell capacitor CS from the bit line BL. The p-channel sense transistor P1 becomes on or off, depending upon whether or not a written electric change exists on a capacitor node "n1".

In a reading, the read word line RWL is dropped to a low voltage so as to turn on the p-channel write transistor P2, so that an on/off condition of the sense transistor P1 is read out to the bit line BL.

Referring to FIG. 3, there is shown a diagrammatic partial sectional view of the gain cell proposed by Japanese Patent Application Laid-open Publication No. JP-A-01-255269 and U.S. Pat. No. 4,920,391. FIG. 4 is an equivalent circuit diagram of the gain cell proposed by Japanese Patent Application Laid-open Publication No. JP-A-01-255269 and U.S. Pat. No. 4,920,391. In the following, the prior art disclosed by Japanese Patent Application Laid-open Publication No. JP-A-01-255269 and U.S. Pat. No. 4,920,391 will be called a "second prior art".

As shown in FIG. 3, the gain cell of the second prior art includes an n-type silicon substrate 121, a pair of $p^+$ diffused regions 122 and 122A formed in a principal surface of the substrate, separately from each other, and a first gate insulator film 123 located on the principal surface of the substrate between the pair of $p^+$ diffused regions 122 and 122A. A first polysilicon film 124 of an n-type is formed on the first gate insulator film 123. Thus, a p-channel read transistor P2 as shown in the equivalent circuit of FIG. 4 is constituted to have a pair of source/drain regions formed of the pair of $p^+$ diffused regions 122 and 122A and a gate electrode formed of the first polysilicon film 124.

Furthermore, on the first polysilicon film 124, a second polysilicon film 125 surrounded by a second gate insulator film 126 is formed. A third polysilicon film 127 of a p-type is formed to cover the second gate insulator film 126. A n⁺ polysilicon film 128 is formed in a part of the third polysilicon film 127 located above a top surface of the second polysilicon film 125. Thus, an n-channel write transistor N1 as shown in FIG. 4, is formed which has a pair of source/ drain regions formed of the first polysilicon film 124 and the n⁺ polysilicon film 128, and a gate electrode formed of the second polysilicon film 125.

Now, operation of the gain cell of the second prior art will be described with reference to FIG. 4. In a writing, a word line WL is elevated to a high voltage so as to turn on the n-channel write transistor N1 connected to a write bit line WBL, so that an information electric charge is written into a gate node "n2". Thus, an electric charge of the amount determined by a capacitance division ratio between a coupling capacitor CC and a gate capacitor CG of the p-channel read transistor P2, is stored in the gate capacitor CG. Here, the coupling capacitor CC is constituted of the first polysilicon film 124, the second gate insulator film 126 and the second polysilicon film 125.

In a reading, the word line WL is dropped to a low voltage so as to drop the gate voltage of the read transistor P2 through the coupling capacitor CC. At this time, the read transistor P2 is turned on or off, dependently upon the electric charge stored in the gate capacitor CG. Thus, a corresponding signal is read out onto the reading bit line RBL. Incidentally, it is ordinary cases that a voltage Vss in FIG. 4 is a ground level.

The above mentioned gain cells in the prior art have a stacked structure in which a thin film transistor formed of a polysilicon films is stacked on a bulk transistor formed in a semiconductor substrate. One of the thin film transistor and the bulk transistor is used for the writing, and the other is used for the sensing. A gate of the sense transistor is connected to a cell capacitor, or constitutes the cell capacitor, so that the sense transistor is turned on or off, dependently upon existence or non-existence of an electrode charge stored in the cell capacitor, whereby the stored electric charge is amplified by the sense transistor. In addition, the thin film transistor and the bulk transistor are different in the conduction channel type.

However, the above mentioned gain cells in the prior art have various problems, which can be divided into three aspects, namely, a problem concerning a manufacturing, a problem concerning a cell area, and a problem concerning a peripheral control circuit.

The problem concerning the manufacturing is that: Since each of the prior art gain cells has the two gate electrodes of two different levels stacked on each other, the degree of planarization is deteriorated, and therefore, a manufacturing process becomes difficult to execute. The degree of a convex-concave of the surface caused by the deteriorated degree of planarization reaches at least a double of that in the conventional 1T/1C DRAM memory cell. Accordingly, a planarizing process for the interlayer insulator film, and a lithographic process and an etching process for the wiring conductor pattering, particularly become difficult.

The problem concerning the cell area is that: Two lines are required for either the bit line or the word line, and therefore, the required cell area is increased by an additional contact area and an additional wiring conductor area, as compared with the conventional 1C/1T DRAM memory cell. For example, in the first prior art shown in FIGS. 1 and 2, it might be seen that no extra wiring area is required. However, since the first prior art has such a structure that an upper contact and a lower contact are stacked, the positions of the upper contact and the lower contact in a plan view must be actually shifted from each other. This means that a doubled contact area is required in an actual device. In addition, at a peripheral region of the memory cell array, a contact must be provided for each of the read word line and the write word line, and therefore, a wasteful area is required.

Here, it is to be remembered that the gain cell was firstly invented because it has become difficult to ensure a sufficient cell capacitor capacitance in a cell area reduced because of an increased integration density of the DRAM. If the gain cell requires a large area, it is no longer valuable to adopt the gain cell, because the conventional 1C/1T DRAM memory cell having a sufficient cell capacitor capacitance can be fabricated in the large area.

The problem concerning the peripheral control circuit is that: Since the prior art gain cell have both the p-channel transistor and the n-channel transistor, the polarity of the word line potential must be inverted when the operation changes from the reading to the writing or vice versa. In some cases, furthermore, both the write bit line and the read bit line must be controlled in potential. As a result, a peripheral circuit becomes more complicated than that of the conventional 1T/1C DRAM memory cell.

SUMMARY OF THE INVENTION

Accordingly, it is an object of the present invention to provide a semiconductor memory which has overcome the above mentioned defect of the conventional ones.

Another object of the present invention is to provide a DRAM memory cell which has an internal amplification function but which has overcome the above mentioned problems of the three aspects in the conventional gain cells.

The inventor considers that, the above mentioned problems of the first and second prior art gain cells have been occurred because these gain cells have been designed on such a premise that the gain cell has to be able to be read out non-destructively. Here, it is so defined that, when an information electric charge is extracted from the cell capacitor in the reading operation, it is called a "destructive read-out", and when an information electric charge is not extracted from the cell capacitor in the reading operation, it is called a "non-destructive read-out". Therefore, since the electric charge is read out from only the sense transistor in the above mentioned first and second prior art gain cells, the "non-destructive read-out" is performed.

Because there has been imposed such a restriction that no information electric charge is extracted from the cell capacitor in the reading operation, the prior art gain cells had required an extra word line or an extra bit line, as compared with the conventional 1T/1C DRAM memory cell. Furthermore, the prior art gain cells had required both the p-channel and n-channel transistors in each memory cell, and a complicated peripheral control circuit. In the conventional DRAM, after an electric charge is written into a capacitor, since the condition returns to a thermally equilibrium condition for a relatively short time, a re-writing is inherently required for the DRAM. This is also true in the gain cell. Accordingly, it is not necessary to adhere the "non-destructive read out".

A specific object of the present invention is to provide a "destructive read out" type DRAM memory cell which has an internal amplification function but which has overcome the above mentioned problems of the three aspects in the conventional gain cells.

The above and other objects of the present invention are achieved in accordance with the present invention by a semiconductor memory comprising one capacitor having a capacitor electrode and an opposing electrode, one insulated gate field effect transistor formed in a semiconductor substrate and having a gate electrode connection to a word line and a pair of source/drain regions, one of the pair of source/drain regions being connected to the capacitor electrode of the capacitor, and a thin film transistor formed above the insulated gate field effect transistor and having the same channel conductivity type as that of the insulated gate field effect transistor, the thin film transistor having a first gate electrode and a second gate electrode, the first gate electrode being constituted of the gate electrode of the insulated gate field effect transistor, the second gate electrode being constituted of the capacitor electrode of the capacitor, a source region of the thin film transistor being connected to the other of the pair of source/drain regions of the insulated gate field effect transistor and to a bit line, and a drain region of the thin film transistor being connected to a power supply line.

In one embodiment, the drain region of the thin film transistor constitutes the opposing electrode of the capacitor.

In another embodiment, the capacitor is formed in a trench formed in a surface of the semiconductor substrate, and the opposing electrode of the capacitor is fixed to a potential different from that of the power supply line.

In the above mentioned construction of the DRAM memory cell, there exists only one word line which is used both in the writing and in the reading, and which constitutes the gate electrode of the insulated gate field effect transistor formed in the semiconductor substrate. On the gate electrode, the thin film transistor for amplification and reading is stacked through a gate insulator film. This thin film transistor has not only a gate electrode constituted of the word line but also another gate electrode connected to one electrode (capacitor electrode) of the cell capacitor of the memory cell. When an on-voltage is applied to both the two gate electrodes of the thin film transistor, this thin film transistor is turned on.

Furthermore, since the insulated gate field effect transistor formed in the semiconductor substrate and the thin film transistor formed above the insulated gate field effect transistor are of the same channel conductivity type, the sources of both the transistors are connected to the same bit line, which is used both in the writing and in the reading.

Thus, since only one word line and only one bit line are provided for each one memory cell, and since all the transistors provided in the memory cell are of the same channel conductivity, the DRAM memory cell in accordance with the present invention requires neither an extra contact area nor an extra wiring area, as compared with the conventional 1T/1C DRAM memory cell, and the DRAM memory cell in accordance with the present invention can be realized in a memory cell area which is equal to or less than that required in the conventional 1T/1C DRAM memory cell.

Furthermore, since all the transistors provided in the memory cell are of the same single channel conductivity, it is no longer necessary to pay attention mutual diffusion of different impurities included in source/drain regions of different conductivity types. Therefore, the manufacturing process is easy and simple. In addition, since all the transistors provided in the memory cell are of the same single channel conductivity, it is also not necessary to invert the polarity of the word line potential when the operation changes from the reading to the writing and vice versa, and therefore, the peripheral control circuit can be simplified.

In the above mentioned DRAM memory cell in accordance with the present invention, an electric charge is amplified in the reading operation by extracting the current from both of the cell capacitor of the memory cell and the reading thin film transistor. Accordingly, the "destructive read-out" is performed, differently from the conventional gain cell mentioned hereinbefore.

The above and other objects, features and advantages of the present invention will be apparent from the following description of preferred embodiments of the invention with reference to the accompanying drawings.

DESCRIPTION OF THE PREFERRED EMBODIMENTS

Figure 1:
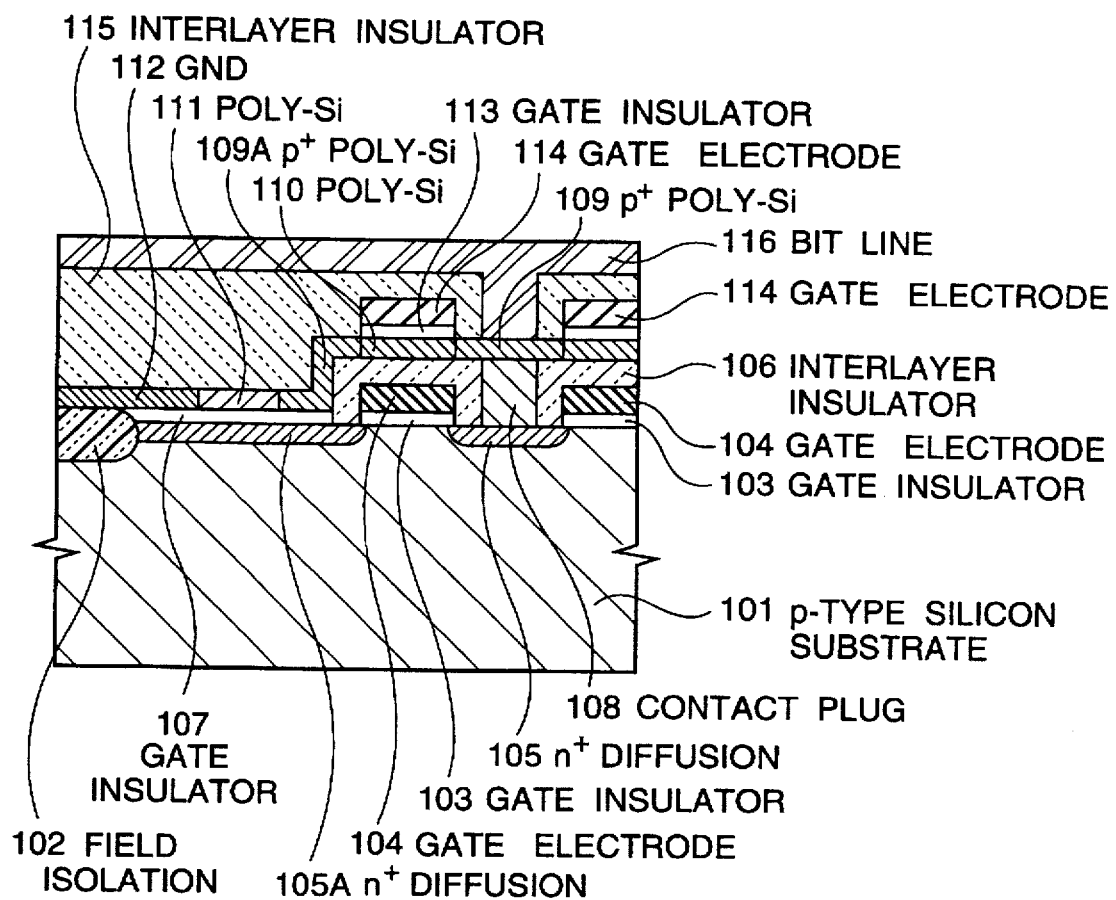
FIG. 1 is a diagrammatic partial sectional view of a first example of the prior art gain cell.
Figure 2:
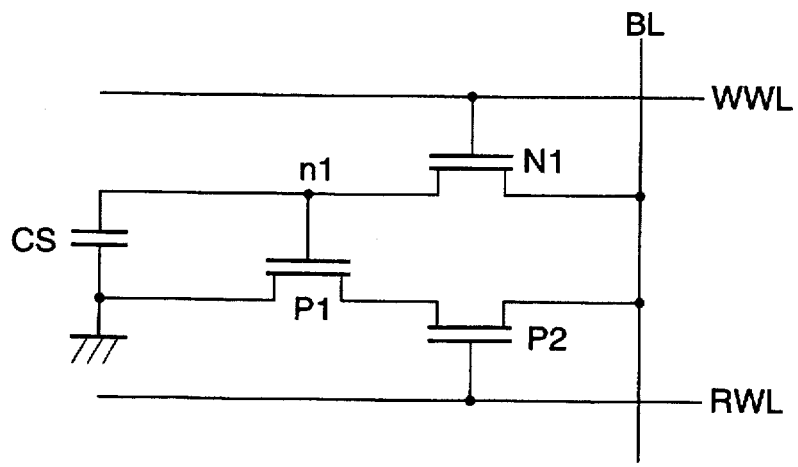
FIG. 2 is an equivalent circuit diagram of the gain cell shown in FIG. 1.
Figure 3:
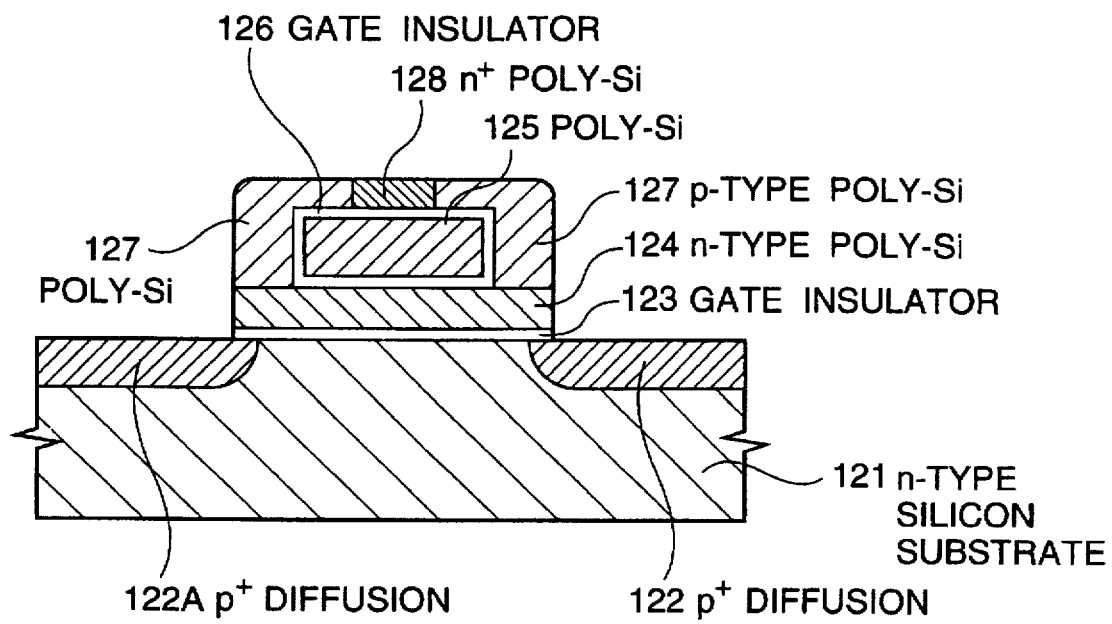
FIG. 3 is a diagrammatic partial sectional view of a second example of the prior art gain cell.
Figure 4:
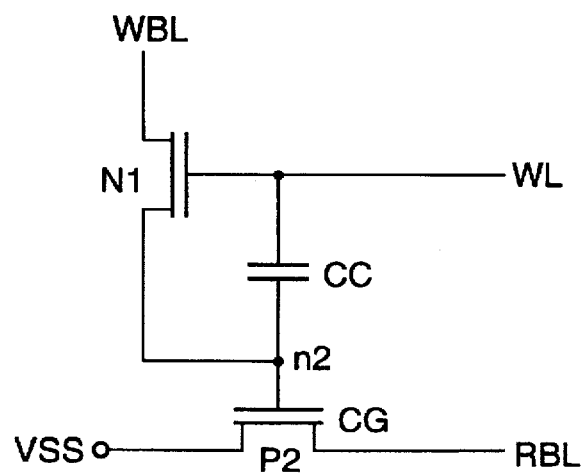
FIG. 4 is an equivalent circuit diagram of the gain cell shown in FIG. 3.
Figure 5:
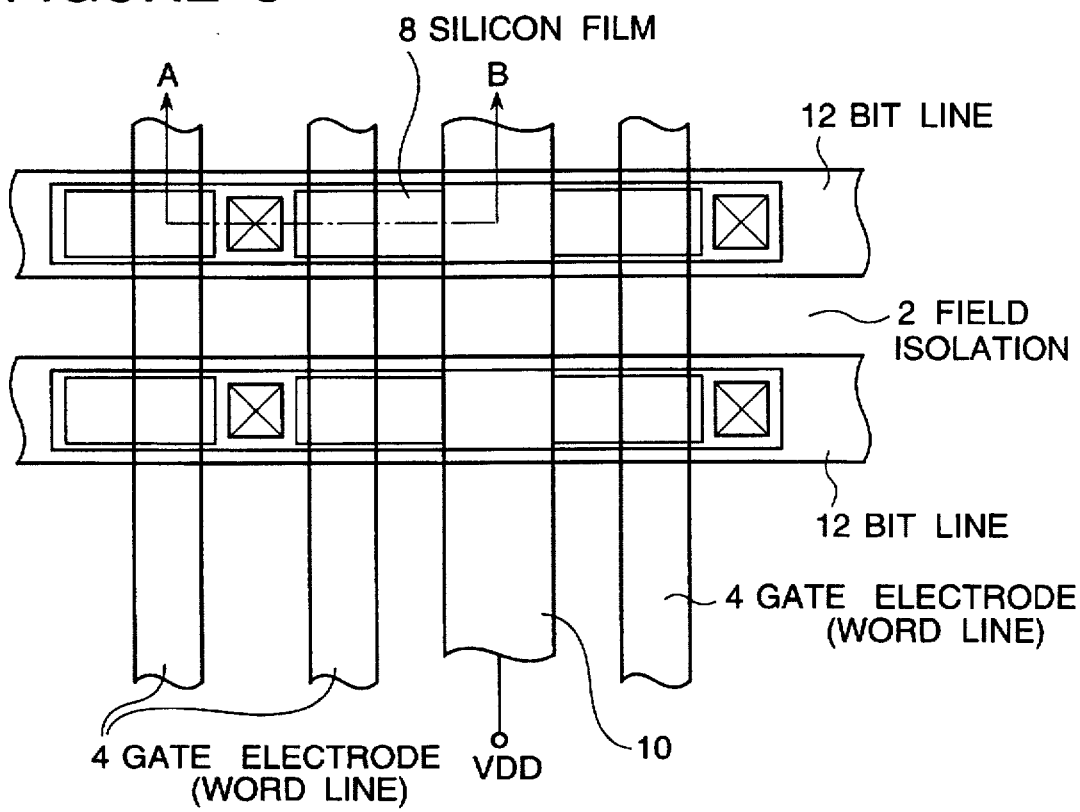
FIG. 5 is a layout pattern diagram of a first embodiment of the DRAM memory cell in accordance with the present invention.
Figure 6:
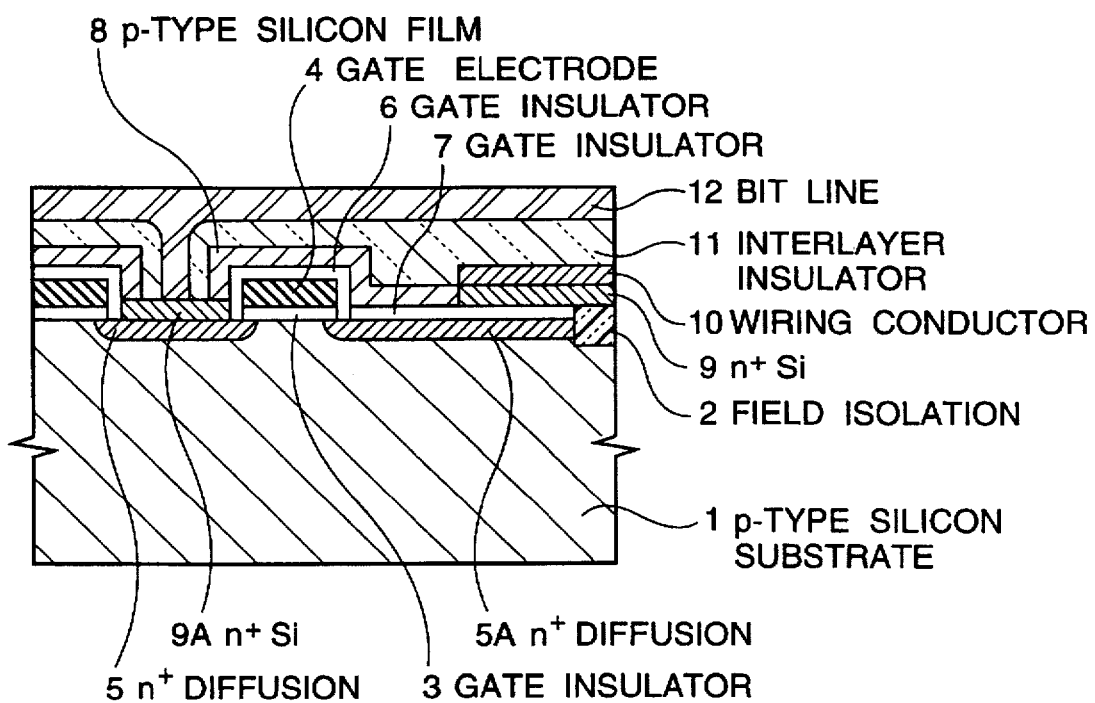
FIG. 6 is a diagrammatic partial sectional view taken along the line A—B, of the first embodiment of the DRAM memory cell in accordance with the present invention shown in FIG. 5.

Referring to FIG. 5, there is shown a layout pattern diagram of a first embodiment of the DRAM memory cell in accordance with the present invention. FIG. 6 is a diagrammatic partial sectional view taken along the line A—B in FIG. 5. In FIGS. 5 and 6, the same constituent is designated by the same Reference Numeral.

The shown embodiment of the gain cell in accordance with the present invention includes a p-type silicon substrate 1 having a field isolation insulator 2 formed on a principal surface thereof. In a device formation region defined by the field isolation insulator 2, a gate electrode 4 is formed through a first gate insulator film 3 on the principal surface of the silicon substrate 1, and a pair of $n^+$ diffused regions 5 and 5A are formed in the principal surface of the silicon substrate 1, separately from each other, as a pair of source/drain regions forming therebetween a channel region covered by the gate insulator film 3. Thus, an n-channel write transistor (designated by "N1" in an equivalent circuit diagram of FIG. 7) is formed.

Furthermore, a second gate insulator film 6 is deposited to cover the gate electrode 4, and a third gate insulator film 7 is formed on the n$^+$ diffused region 5A. This third gate insulator film 7 is formed of, for example, a double-layer insulator film composed of a silicon oxide film and a silicon nitride film stacked thereon. Thereafter, a p-type silicon film 8 is deposited to cover the whole of the second gate insulator film 6 and a portion of the third gate insulator film 7 adjacent to the second gate insulator film 6.

As clearly shown in FIG. 6, n$^+$ silicon films 9A and 9 are formed to respectively cover the n$^+$ diffused region 5 and the remaining portion of the third gate insulator film 7 remote from the second gate insulator film 6. An amplification wiring conductor 10 is formed on the n$^+$ silicon film 9, in electric contact with the n$^+$ silicon film 9.

Thus, a sense transistor (designated by "N2" in the equivalent circuit diagram of FIG. 7) is formed, which includes a gate electrode formed of the n$^+$ diffused region 5A, a gate insulator film formed of the third gate insulator film 7, and a drain region formed of the n$^+$ silicon film 9. In addition, a read transistor (designated by "N3" in the equivalent circuit diagram of FIG. 7) is formed, which includes a gate electrode formed of the gate electrode 4, a gate insulator film formed of the second gate insulator film 6, and a source region formed of the n$^+$ silicon film 9A. Thus, the p-type silicon film 8 constitutes a channel region in common to both the sense transistor N2 and the read transistor N3. Therefore, the sense transistor N2 and the read transistor N3 are connected in series to each other by the common channel region.

From a different viewpoint, it can be said that a double gate thin film field effect transistor is formed which have the source region formed of the n$^+$ silicon film 9A, the drain region formed of the n$^+$ silicon film 9, a first gate electrode formed of the gate electrode 4, a second gate electrode formed of the n$^+$ diffused region 5A, and the channel region constituted of the p-type silicon film 8.

Figure 7:
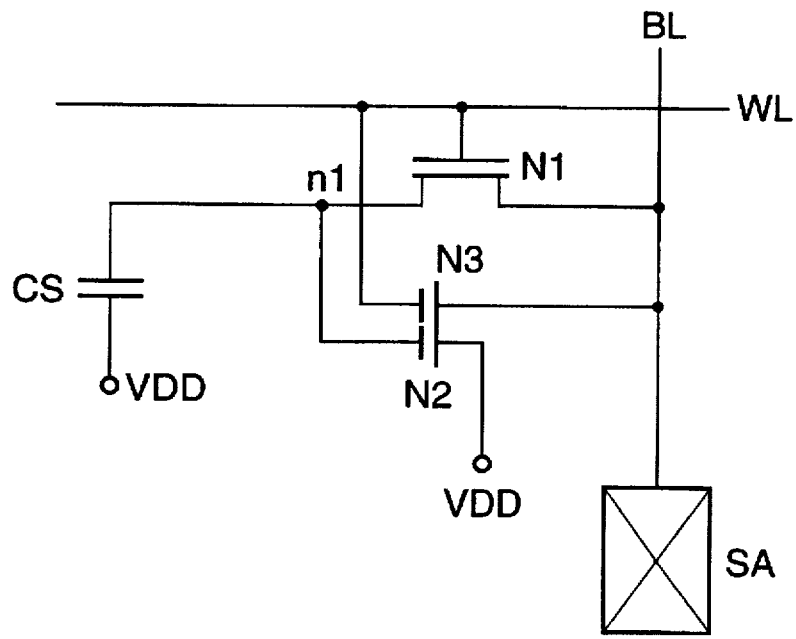
FIG. 7 is an equivalent circuit diagram of the first embodiment of the DRAM memory cell in accordance with the present invention shown in FIG. 5.

In the shown embodiment, the amplification wiring conductor 10 is connected to a power supply voltage VDD (in the equivalent circuit diagram of FIG. 7). In addition, a cell capacitor (designated by "CS" in the equivalent circuit diagram of FIG. 7) is composed of a capacitor electrode formed of the n$^+$ silicon film 9, an opposing electrode formed of the n$^+$ diffused region 5A, and a capacitor dielectric formed of the third gate insulator film 7 and sandwiched between the capacitor electrode and the opposing electrode.

Furthermore, an interlayer insulator film 11 formed of a silicon oxide film having a relatively large thickness is deposited to cover the sense transistor and the read transistor, and a bit wiring line 12 is located on the interlayer insulator film 11 and connected to the n$^+$ silicon film 9A through a hole formed in the interlayer insulator film 11.

As mentioned above, the gain cell of the present invention is so configured that the write transistor N1 and the read transistor N3 have a common gate electrode, and only one word line and only one bit line are provided for one memory cell. Therefore, the gain cell of the present invention apparently has the same construction as that of the conventional 1T/1C DRAM memory cell.

Figure 8:
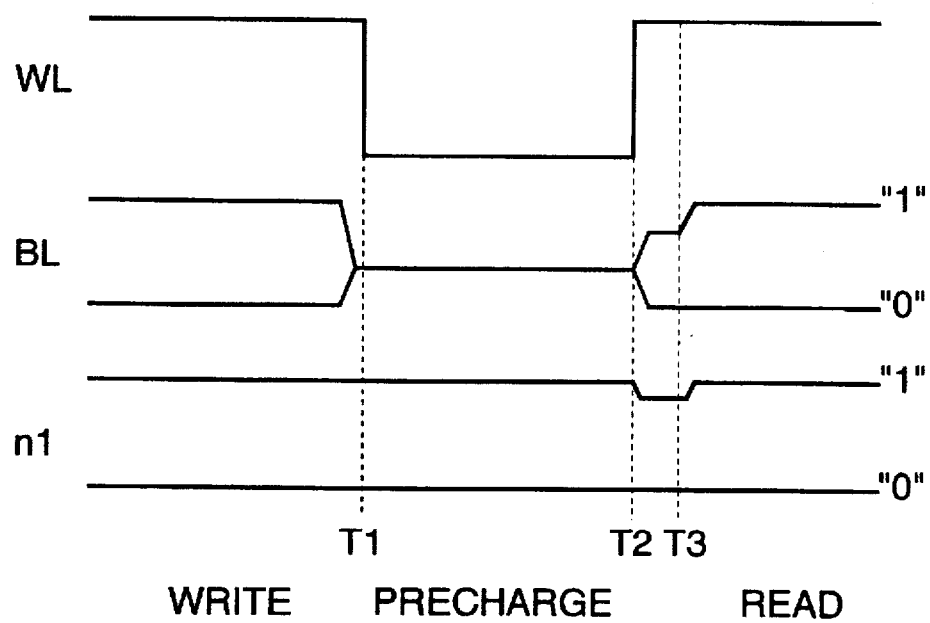
FIG. 8 is a timing chart illustrating an operation of the first embodiment of the DRAM memory cell in accordance with the present invention shown in FIG. 5.

Now, operation of the gain cell of the present invention will be described with reference to the equivalent circuit diagram of FIG. 7 and the time chart of FIG. 8. A largest difference between the gain cell of the present invention and the prior art gain cells mentioned hereinbefore is that the gain cell of the present invention is configured to perform the "destructive read out" as mentioned above.

A writing operation is as follows: When "1" is written, the bit line BL (connected to a sense amplifier SA) and a word line W1 are brought to a high voltage, an electric charge is written into the cell capacitor CS through the write transistor N1. When a sufficient amount of electric charge is stored in the cell capacitor CS, both of the sense transistor N2 and the read transistor N3 are turned on, but since the drain of the sense transistor N2 is connected to the power supply voltage VDD, the read transistor N3 does not contribute a charge transfer.

In the writing of "0", when "0" is written into the cell capacitor CS, the sense transistor N2 is maintained off. Therefore, the gain cell of the present invention performs the same operation as that of the conventional 1T/1C DRAM memory cell.

Incidentally, when "0" is written into the cell capacitor CS which has been written with "1", the cell capacitor is discharged, and when the voltage of a capacitor node "n1" drops, the sense transistor N2 is turned off. At this time, the writing of "0" is completed.

The reading operation is follows: First, as shown in FIG. 8, a precharge operation is performed after a time "T1". Here, a threshold voltage of the read transistor N3 is set to be lower than a threshold voltage of the write transistor N1. At the moment T2 the word line WL is brought to a high voltage, if the cell capacitor CS stores a sufficient, amount of electric charge, namely, if "1" has been written, both of the sense transistor N2 and the read transistor N3 are turned on. Therefore, an electric charge flows from the power supply VDD through the sense transistor N2 and the read transistor N3 to the bit line BL. At this situation, since the transistor N1 becomes on in accordance with a voltage elevation of the word line WL, the voltage of the capacitor node "n1" gradually drops so that the sense transistor N2 is turned off, and therefore, the charge injection from the voltage supply VDD to the bit line BL is terminated. Thereafter, at a timing T3, the sense amplifier SA is activated, so that the potential of the bit line BL is elevated to an operation potential. The mount of charge injection into the bit line BL and the rising time of the bit line are determined by a difference in a threshold between the write transistor N1 and the read transistor N3.

When the word line WL is brought to a high voltage, if a sufficient amount of electric charge is not stored in the cell capacitor CS, namely, if "0" has been written, the sense transistor 112 is maintained off, since the threshold of the sense transistor N2 is larger than 0 V. Namely, no electric charge is injected from the power supply VDD to the bit line BL. Accordingly, in this situation, the gain cell of the present invention operates similarly to the conventional 1T/1C DRAM memory cell.

In order to quantitatively know how the bit line output voltage in the reading is determined by the difference in the threshold between the write transistor N1 and the read transistor N3, a circuit operation simulation was performed by fixing the threshold of the write transistor N1 to 1 V.

Figure 9:
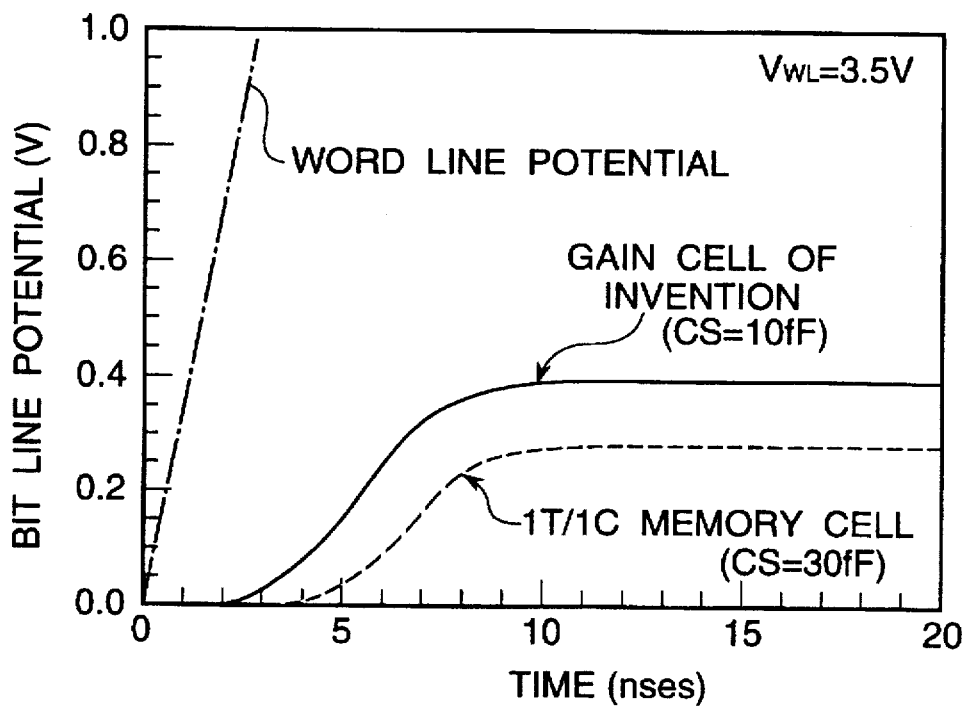
FIG. 9 is a graph showing a bit line potential change in the first embodiment of the DRAM memory cell in accordance with the present invention shown in FIG. 5.

Referring to FIG. 9, there is shown a graph illustrating a change with time of the bit line voltage when "1" is read out. Here, it was assumed that a substrate bias voltage of the write transistor N1 is −1 V, and a rising time until the word line is elevated to 3.5 V is 10 nsec, and also, the threshold of the read transistor N3 is 0.4 V. In addition, it was also assumed that the word line potential linearly elevates with time, and the precharge potential of the bit line and the power supply voltage VDD are 0 V and 2 V, respectively.

As seen from FIG. 9, if the threshold of the read transistor N3 is set at 0.4 V, even if the capacitance of the cell capacitor CS is 10 fF, it is possible to obtain an output signal larger than that obtained in the conventional 1T/1C DRAM memory cell of CS=30 fF.

Figure 10:
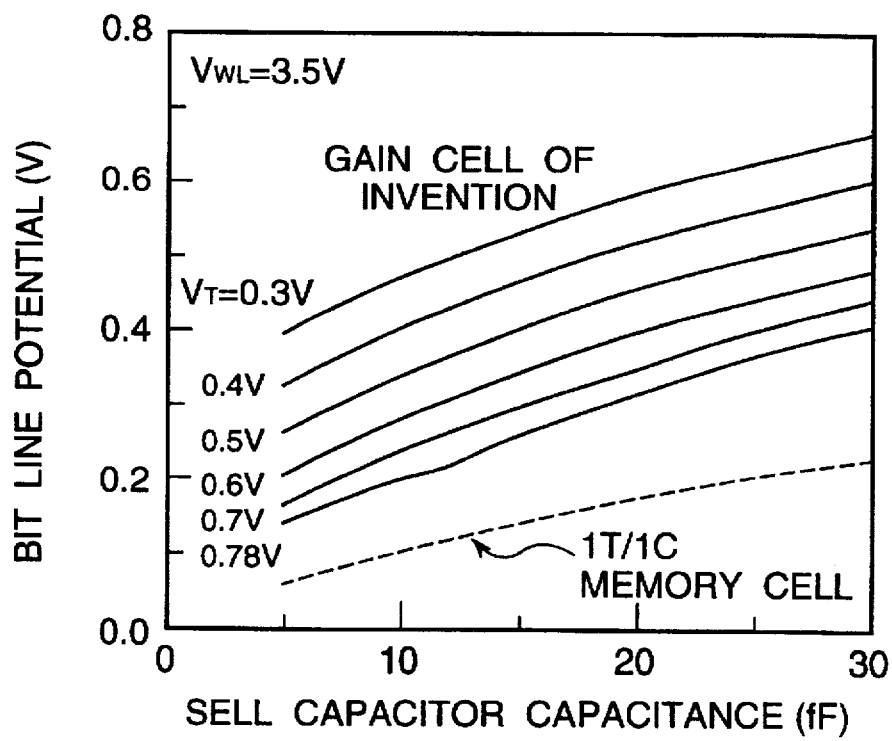
FIG. 10 is a graph showing a relation between the bit line potential and the cell capacitor capacitance.

Referring to FIG. 10, there is shown a graph illustrating a dependency of the bit line output voltage upon the threshold VT of the read transistor N3. From FIG. 10 it would be understood that, even if VT=0.78 V, if CS=10 fF, it is possible to obtain a bit line output voltage comparable to that obtained in the conventional 1T/1C DRAM memory cell of CS=25 fF. The lower the threshold of the read transistor N3 is, the larger the bit line output voltage becomes.

As seen from the above, the gain cell of the present invention can obtain a sufficient bit line output voltage with a small cell capacitor capacitance, without bringing the word line to different voltages in the reading operation and the writing operation, respectively. In addition, since the control of the word line is the same as that for the conventional 1T/1C DRAM memory cell, the peripheral control circuit for the memory cell array can be simplified.

Figure 11:
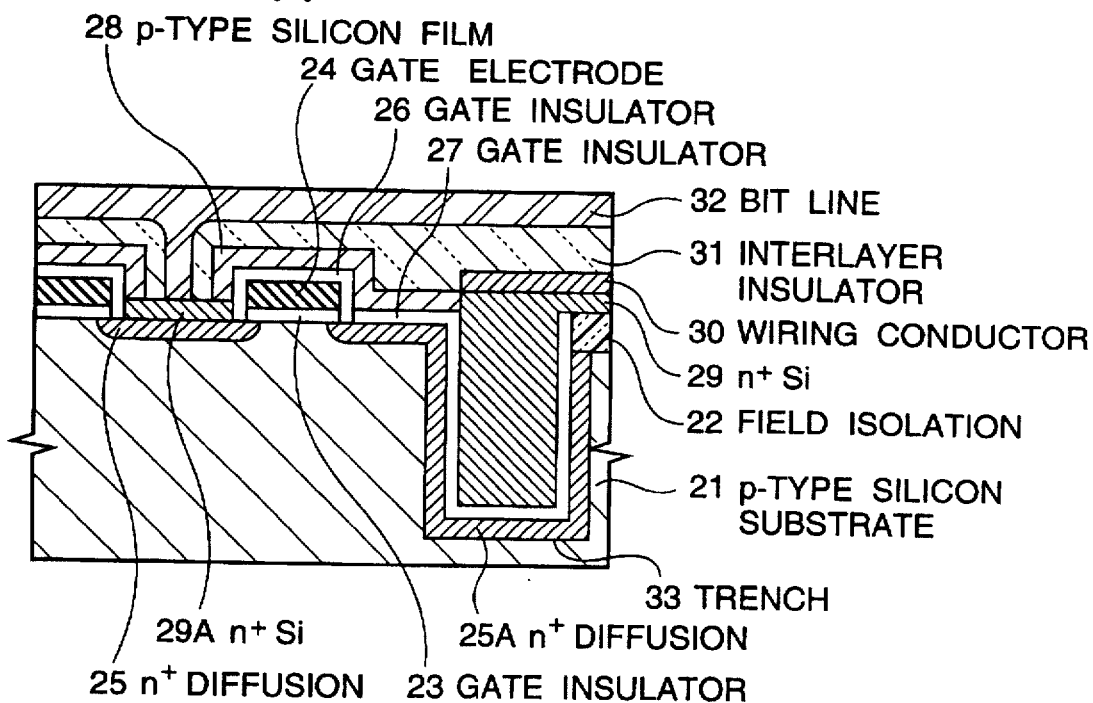
FIG. 11 is a diagrammatic partial sectional view of a second embodiment of the DRAM memory cell in accordance with the present invention.

Referring to FIG. 11, there is shown a diagrammatic partial sectional view of a second embodiment of the DRAM memory cell in accordance with the present invention. This second embodiment is characterized in that the sense transistor and the cell capacitor are formed in a trench formed in the semiconductor substrate.

Similarly to the first embodiment, the second embodiment includes a p-type silicon substrate 21 having a field isolation insulator 22 formed on a principal surface thereof. In a device formation region defined by the field isolation insulator 22, a trench 33 is formed in the silicon substrate 21 to extend downward from the principal surface of the silicon substrate 21 so as to reach a substantial depth, and a gate electrode 24 is formed through a first gate insulator film 23 on the principal surface of the silicon substrate 21. A pair of $n^+$ diffused regions 25 and 25A are formed in the principal surface of the silicon substrate 21, separately from each other, as a pair of source/drain regions forming therebetween a channel region covered by the gate insulator film 3. The $n^+$ diffused regions 25A extends over not only the principal surface of the silicon substrate 21 but also an internal surface of the trench 33. Thus, an n-channel write transistor (designated by "N1" in the equivalent circuit diagram of FIG. 7) is formed.

Furthermore, a second gate insulator film 26 is deposited to cover the gate electrode 24, and a third gate insulator film 27 is formed on the $n^+$ diffused region 25A. This third gate insulator film 27 covers not only the principal surface of the silicon substrate 21 but also the internal surface of the trench 33. Thereafter, a p-type silicon film 28 is deposited to cover the whole of the second gate insulator film 26 and a portion of the third gate insulator film 27 positioned on the principal surface of the silicon substrate 21.

Furthermore, $n^+$ silicon films 29A and 29 are formed to cover the $n^+$ diffused region 25 and the remaining portion of the third gate insulator film 27 covering the internal surface of the trench 33, respectively. Further, the $n^+$ silicon film 29 completely fills the trench 33. An amplification wiring conductor 30 is formed on the $n^+$ silicon film 29, in electric contact with the $n^+$ silicon film 29.

Thus, a sense transistor (designated by "N2" in the equivalent circuit diagram of FIG. 7) is formed, which includes a gate electrode formed of the $n^+$ diffused region 25A, a gate insulator film formed of the third gate insulator film 27, and a drain region formed of the $n^+$ silicon film 29. In addition, a read transistor (designated by "N3" in the equivalent circuit diagram of FIG. 7) is formed, which includes a gate electrode formed of the gate electrode 24, a gate insulator film formed of the second gate insulator film 26, and a source region formed of the $n^+$ silicon film 29A. The p-type silicon film 28 constitutes a channel region in common to both the sense transistor N2 and the read transistor N3. Therefore, the sense transistor and the read transistor are connected in series to each other.

In the shown embodiment, the amplification wiring conductor 30 is connected to a power supply voltage VDD. In addition, a cell capacitor (designated by "CS" in the equivalent circuit diagram of FIG. 7) is composed of a capacitor electrode formed of the $n^+$ silicon film 29A filled in the trench 33, an opposing electrode formed of the $n^+$ diffused region 25A formed in the internal surface of the trench 33, and a capacitor dielectric formed of the third gate insulator film 27 coveting in the internal surface of the trench 33.

Furthermore, an interlayer insulator film 31 is formed to cover the sense transistor and the read transistor, and a bit wiring line 32 is located on the interlayer insulator film 31 and connected to the $n^+$ silicon film 29A through a hole formed in the interlayer insulator film 31.

In the second embodiment, since the sense transistor and the cell capacitor is formed within the trench, a required area for each one memory cell can be reduced, and on the other hand, the capacitance of the cell capacitor can be increased, so that the operation of the memory cell is stabilized.

Figure 12:
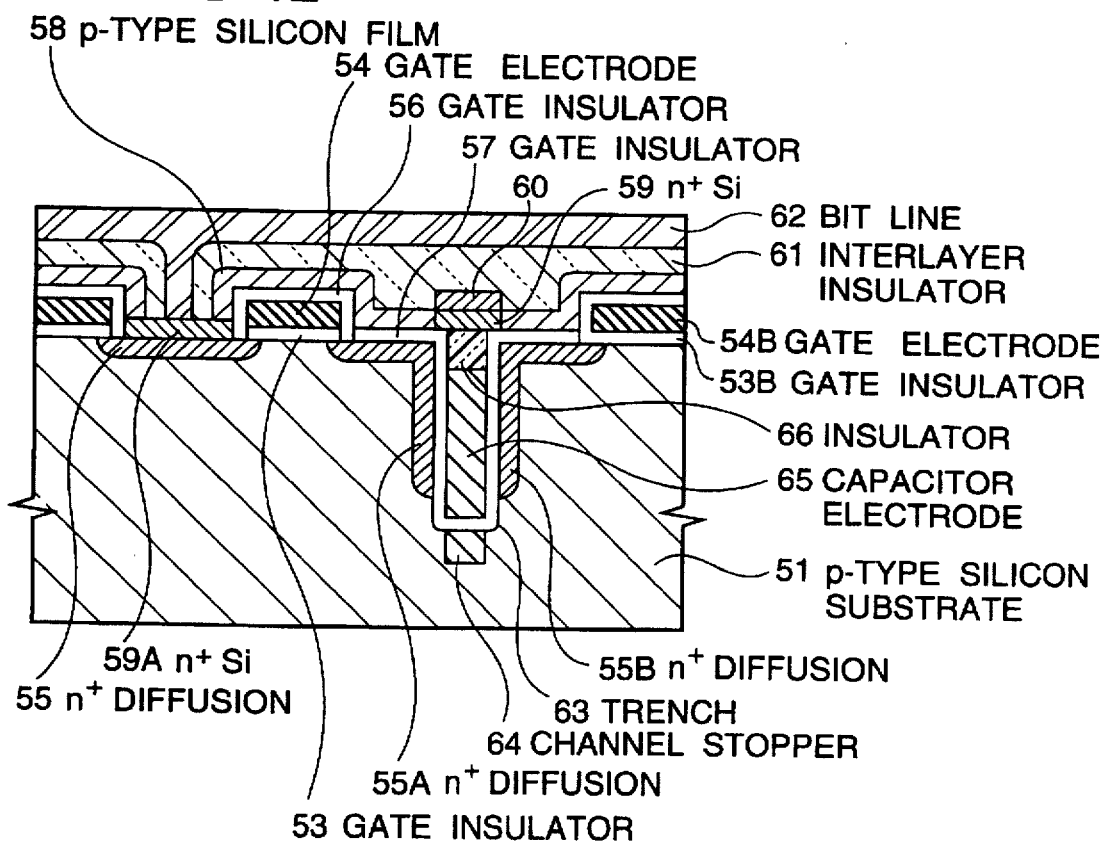
FIG. 12 is a diagrammatic partial sectional view of a third embodiment of the DRAM memory cell in accordance with the present invention.

Referring to FIG. 12, there is shown a diagrammatic partial sectional view of a third embodiment of the DRAM memory cell in accordance with the present invention. This third embodiment is characterized in that only the cell capacitor is formed within a trench formed in a semiconductor substrate, independently of the sense transistor.

Similarly to the second embodiment, the third embodiment includes a trench 63 formed in a p-type silicon substrate 51 to extend downward from a principal surface of the silicon substrate 51 so as to reach a substantial depth. At a bottom of the trench 63, a channel stopper 64 is formed. In addition, at each side of the trench 63 in FIG. 12, a gate electrode 54 or 54B is formed through a first gate insulator film 53 or 53B on the principal surface of the silicon substrate 51.

At a left side of the trench 63 in FIG. 12, a pair of $n^+$ diffused regions 55 and 55A are formed in the principal surface of the silicon substrate 51, separately from each other, as a pair of source/drain regions forming therebetween a channel region covered by the gate insulator film 6. The $n^+$ diffused regions 55A extends over not only the principal surface of the silicon substrate 51 but also an internal left side surface of the trench 63. Thus, an n-channel write transistor (designated by "N1" in the equivalent circuit diagram of FIG. 7) is formed. At a right side of the trench 63 in FIG. 12, a similar write transistor (the whole of which is not shown in FIG. 12) is formed, and an $n^+$ diffused regions 55B extends over an internal right side surface of the trench 63.

At the left side of the trench 63 in FIG. 12, furthermore, a second gate insulator film 56 is deposited to cover the gate electrode 54, and a third gate insulator film 57 is formed on the $n^+$ diffused region 55A. This third gate insulator film 57 covers not only the principal surface of the silicon substrate 51 but also the whole of an internal surface of the trench 63.

Thereafter, a p-type silicon film 58 is deposited to cover the whole of the second gate insulator film 56 and a portion of the third gate insulator film 57 positioned on the principal surface of the silicon substrate 51.

An $n^+$ diffused layer 66 is formed to substantially fill the trench 63, and an insulator 66 is formed to completely cover a top of the $n^+$ diffused layer 66. Furthermore, an $n^+$ silicon films 59A and 59 are formed to cover the $n^+$ diffused region 55 and the insulator 66. An amplification wiring conductor 60 is formed on the $n^+$ silicon film 59, in electric contact with the $n^+$ silicon film 59.

Thus, a sense transistor (designated by "N2" in the equivalent circuit diagram of FIG. 7) is formed, which includes a gate electrode formed of the $n^+$ diffused region 55A, a gate insulator film formed of the third gate insulator film 57, and a drain region formed of the $n^+$ silicon film 59. In addition, a read transistor (designated by "N3" in the equivalent circuit diagram of FIG. 7) is formed, which includes a gate electrode formed of the gate electrode 54, a gate insulator film formed of the second gate insulator film 56, and a source region formed of the $n^+$ silicon film 59A. The p-type silicon film 58 constitutes a channel region in common to both the sense transistor N2 and the read transistor N3. Therefore, the sense transistor and the read transistor are connected in series to each other.

In the shown embodiment, the amplification wiring conductor 60 is connected to a power supply voltage VDD. In addition, a cell capacitor (designated by "CS" in the equivalent circuit diagram of FIG. 7) is composed of a capacitor electrode formed of the $n^+$ diffused layer 65 filled in the trench 63, an opposing electrode formed of the $n^+$ diffused region 55A formed in the internal left-side surface of the trench 63, and a capacitor dielectric formed of the third gate insulator film 57 covering in the internal surface of the trench 63. Here, adjacent memory cells are isolated from each other by the channel stopper. In addition, the capacitor electrode 65 and the $n^+$ silicon film 59A are electrically insulated from each other by the insulator 66.

Furthermore, an interlayer insulator film 61 is formed to cover the sense transistor and the read transistor, and a bit wiring line 62 is located on the interlayer insulator film 61 and connected to the $n^+$ silicon film 59A through a hole formed in the interlayer insulator film 61.

As seen from the above, the $n^+$ silicon film 59A, the amplification wiring conductor 60, the capacitor electrode 65 and the insulator 66 are in common to a memory cell formed at the right side of the trench 63 in FIG. 12.

In the third embodiment, since the cell capacitors of the two memory cells are formed in one trench, it is possible to greatly reduce the required cell area for the gain cell. In addition, since it it possible to set the voltage of the capacitor electrode 65, independently of the voltage of the amplification wiring conductor 60, it is possible to select a half of the power supply voltage VDD, so as to reduce a stress acting the third gate insulator film 57. Accordingly, reliability of the memory cell can be elevated.

In all the above mentioned embodiments, the transistors included in the memory cell are of the n-channel type. But, it would be apparent to person skilled in the art that the transistors included in the memory cell can be of a p-channel type. This can be realized by inverting the conductivity type of the various regions and layers.

As mentioned above, the DRAM memory cell in accordance with the present invention having an internal amplification function is characterized in that only one word line and only one bit line are required and only one channel conductivity type of transistors are included in each memory cell. Accordingly, the memory cell itself can have the internal amplification function with requiring neither an extra contact area nor an extra wiring area. In other words, the DRAM gain cell in accordance with the present invention can be realized in a memory cell area which is equal to or less than that required in the conventional 1T/1C DRAM memory cell.

Furthermore, since all the transistors provided in the memory cell are of the same single channel conductivity, it is no longer necessary to pay attention mutual diffusion of different impurities included in source/drain regions of different conductivity types. Therefore, the manufacturing process is easy and simple. In addition, since all the transistors provided in the memory cell are of the same single channel conductivity type, it is also not necessary to invert the polarity of the word line potential when the operation changes from the reading to the writing and vice versa, and therefore, the peripheral control circuit can be simplified.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory comprising one capacitor having a capacitor electrode and an opposing electrode, one insulated gate field effect transistor formed in a semiconductor substrate and having a gate electrode connected to a word line and a pair of source/drain regions, one of said pair of source/drain regions being connected to said capacitor electrode of said capacitor, and a thin film transistor formed above said insulated gate field effect transistor and having the same channel conductivity type as that of said insulated gate field effect transistor, said thin film transistor having a first gate electrode and a second gate electrode, said first gate electrode being constituted of said gate electrode of said insulated gate field effect transistor, said second gate electrode being constituted of said capacitor electrode of said capacitor, a source region of said thin film transistor being connected to the other of said pair of source/drain regions of said insulated gate field effect transistor and to a bit line, and a drain region of said thin film transistor being connected to a power supply line.

2. A semiconductor memory claimed in claim 1 wherein said drain region of said thin film transistor constitutes said opposing electrode of said capacitor.

3. A semiconductor memory claimed in claim 1 wherein said capacitor is formed in a trench formed in a surface of said semiconductor substrate, and said opposing electrode of said capacitor is fixed to a potential different from that of said power supply line.

* * * * *

UNITED STATES PATENT AND TRADEMARK OFFICE
CERTIFICATE OF CORRECTION

PATENT NO. : 5,675,160
DATED : October 7, 1997
INVENTOR(S) : Ryuichi OIKAWA

It is certified that error appears in the above-identified patent and that said Letters Patent is hereby corrected as shown below:

Column 8, line 51, delete "112" insert --N2--.

Signed and Sealed this

Seventeenth Day of February, 1998

BRUCE LEHMAN

Attest:

Attesting Officer

Commissioner of Patents and Trademarks